(12) United States Patent
Wang et al.

(10) Patent No.: US 10,950,535 B2
(45) Date of Patent: Mar. 16, 2021

(54) PACKAGE STRUCTURE AND METHOD OF MANUFACTURING THE SAME

(71) Applicant: Unimicron Technology Corp., Taoyuan (TW)

(72) Inventors: Chun-Min Wang, Taichung (TW); Pu-Ju Lin, Hsinchu (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/785,630

(22) Filed: Feb. 9, 2020

(65) Prior Publication Data
US 2020/0176369 A1     Jun. 4, 2020

Related U.S. Application Data

(63) Continuation-in-part of application No. 16/420,806, filed on Jan. 7, 2019, now Pat. No. 10,685,922, which
(Continued)

(30) Foreign Application Priority Data

Dec. 11, 2018   (TW) .................................. 107144592
Dec. 13, 2019   (TW) .................................. 108145854

(51) Int. Cl.
*H01L 23/498*     (2006.01)
*H01L 25/10*      (2006.01)
(Continued)

(52) U.S. Cl.
CPC ...... *H01L 23/49833* (2013.01); *H01L 21/486* (2013.01); *H01L 21/4853* (2013.01);
(Continued)

(58) Field of Classification Search
CPC ........... H01L 23/49833; H01L 21/4853; H01L 21/4857; H01L 21/486; H01L 23/3128;
(Continued)

(56) References Cited

U.S. PATENT DOCUMENTS 6,740,985 B1    5/2004  Zhao
7,182,648 B2    2/2007  Han et al.
(Continued)

FOREIGN PATENT DOCUMENTS

CN        101049056 B       6/2011
TW          545098 B        8/2003
(Continued)

OTHER PUBLICATIONS

Jonas Zürcher et al., "Nanoparticle assembly and sintering towards all-copper flip chip interconnects", 2015 IEEE Electronic Components and Technology Conference (ECTC), pp. 1115-1121.
(Continued)

*Primary Examiner* — Timothy J Thompson
*Assistant Examiner* — Michael F McAllister
(74) *Attorney, Agent, or Firm* — CKC & Partners Co., LLC

(57) ABSTRACT

A package structure includes a redistribution structure, a chip, an inner conductive reinforcing element, and a protective layer. The redistribution structure includes a first circuit layer and a second circuit layer disposed over the first circuit layer. The first circuit layer is electrically connected to the second circuit layer. The chip is disposed over the redistribution structure and electrically connected to the second circuit layer. The inner conductive reinforcing element is disposed over the redistribution structure. The inner conductive reinforcing element has a Young's modulus in a
(Continued)

range of from 30 to 200 GPa. The protective layer covers the chip and a sidewall of an opening of the inner conductive reinforcing element.

13 Claims, 12 Drawing Sheets

Related U.S. Application Data is a continuation-in-part of application No. 15/590,020, filed on May 9, 2017, now Pat. No. 10,178,755.

(51) Int. Cl.
  *H01L 23/31* (2006.01)
  *H01L 21/48* (2006.01)
  *H01L 23/00* (2006.01)

(52) U.S. Cl.
  CPC ...... *H01L 21/4857* (2013.01); *H01L 23/3128* (2013.01); *H01L 23/49816* (2013.01); *H01L 23/49822* (2013.01); *H01L 24/16* (2013.01); *H01L 25/105* (2013.01); *H01L 2224/16227* (2013.01); *H01L 2225/1041* (2013.01); *H01L 2225/1058* (2013.01)

(58) Field of Classification Search
  CPC ......... H01L 23/49816; H01L 23/49822; H01L 24/16; H01L 25/105; H01L 2224/16227; H01L 2225/1041; H01L 2225/1058
  USPC .......................................................... 174/260
  See application file for complete search history.

(56) References Cited

U.S. PATENT DOCUMENTS

| | | |
|---|---|---|
| 8,021,921 B2 | 9/2011 | Lin et al. |
| 8,193,624 B1 | 6/2012 | Sohn et al. |
| 8,421,225 B2 | 4/2013 | Ramanathan et al. |
| 8,492,893 B1 | 7/2013 | Sohn et al. |
| 8,791,562 B2 * | 7/2014 | Lee ..................... H01L 25/0655 257/698 |
| 9,117,825 B2 | 8/2015 | Liu et al. |
| 9,192,045 B2 | 11/2015 | Osaki |
| 9,355,977 B2 | 5/2016 | Lin et al. |
| 9,462,690 B1 | 10/2016 | Darveaux et al. |
| 9,472,520 B2 | 10/2016 | Jadhav et al. |
| 9,576,929 B1 | 2/2017 | Shao et al. |
| 9,627,288 B2 * | 4/2017 | Chen ..................... H01L 23/481 |
| 9,679,806 B1 | 6/2017 | Arvin et al. |
| 9,844,134 B2 | 12/2017 | Mischitz et al. |
| 9,875,957 B2 | 1/2018 | Shimizu et al. |
| 9,876,042 B2 | 1/2018 | Yoo et al. |
| 9,899,238 B2 | 2/2018 | Karhade et al. |
| 9,978,710 B2 | 5/2018 | Dubey et al. |
| 2007/0256858 A1 | 11/2007 | Kariya et al. |
| 2009/0273073 A1 | 11/2009 | Tachibana et al. |
| 2010/0084175 A1 * | 4/2010 | Suzuki ................. H05K 1/0231 174/260 |
| 2010/0208442 A1 * | 8/2010 | Asano .................. H05K 1/0271 361/783 |
| 2011/0198114 A1 | 8/2011 | Maeda et al. |
| 2012/0018871 A1 * | 1/2012 | Lee ....................... H01L 23/562 257/698 |
| 2012/0119359 A1 | 5/2012 | Im et al. |
| 2012/0186867 A1 | 7/2012 | Asai et al. |
| 2013/0049229 A1 | 2/2013 | Su |
| 2013/0127054 A1 * | 5/2013 | Muthukumar ...... H01L 23/3121 257/738 |
| 2013/0140074 A1 | 6/2013 | Kariya et al. |
| 2014/0217062 A1 | 8/2014 | Kunstmann et al. |
| 2014/0242374 A1 | 8/2014 | Strasser et al. |
| 2015/0364436 A1 | 12/2015 | Yu et al. |
| 2016/0278214 A1 * | 9/2016 | Hayashi ............... H01L 23/5386 |
| 2016/0351529 A1 | 12/2016 | Brunschwiler et al. |
| 2017/0047302 A1 | 2/2017 | Morita et al. |
| 2017/0194278 A1 | 7/2017 | Shao et al. |
| 2017/0287871 A1 | 10/2017 | Lu |
| 2018/0082933 A1 | 3/2018 | Ko et al. |
| 2018/0332700 A1 | 11/2018 | Tain et al. |
| 2019/0043819 A1 | 2/2019 | Ho et al. |
| 2019/0043847 A1 | 2/2019 | Lee et al. |
| 2019/0189561 A1 | 6/2019 | Rusli |
| 2019/0206756 A1 | 7/2019 | Kim et al. |

FOREIGN PATENT DOCUMENTS

| | | |
|---|---|---|
| TW | I252719 B | 4/2006 |
| TW | 201611218 A | 3/2016 |
| TW | I611546 B | 1/2018 |
| TW | I620303 B | 4/2018 |
| TW | I628775 B | 7/2018 |

OTHER PUBLICATIONS

Jonas Zurcher et al., "All-Copper Flip Chip Interconnects by Pressureless and Low Temperature Nanoparticle Sintering" 2016 IEEE 66th Electronic Components and Technology Conference (ECTC), May 31, 2016-Jun. 3, 2016, Las Vegas, NV,USA.

* cited by examiner

PACKAGE STRUCTURE AND METHOD OF MANUFACTURING THE SAME

CROSS-REFERENCE TO RELATED APPLICATION

This application is a Continuation-in-part of U.S. application Ser. No. 16/240,806, filed on Jan. 7, 2019, which is a continuation-in-part of U.S. application Ser. No. 15/590, 020, filed on May 9, 2017, which issued as U.S. Pat. No. 10,178,755 on Jan. 8, 2019. The prior U.S. application Ser. No. 16/240,806 claims priority to Taiwan Application serial number 107144592, filed Dec. 11, 2018. This application further claims priority to Taiwan Application Serial Number 108145854, filed on Dec. 13, 2019, which is herein incorporated by reference.

BACKGROUND

Field of Invention

The present disclosure relates to a package structure and a method of manufacturing the package structure.

Description of Related Art

Traditionally, a chip package structure includes a substrate, a chip disposed over the substrate, and a packaging material layer covering the chip. Due to large differences in thermal expansion coefficients of the substrate, chip, and packaging material layer, when a thermal process is performed to form the chip and the packaging material layer on the substrate, the chip package structure is often seriously warped. Therefore, a yield of the chip package structure mounted on a printed circuit board is reduced.

On the other hand, when it is desired to form a package-on-package (POP) by forming a package structure over another package structure, the warping phenomenon also causes difficulties in the manufacturing process.

SUMMARY

Some embodiments of the present disclosure provides a package structure, which includes a redistribution structure, a chip, at least one inner conductive reinforcing element, and a protective layer. The redistribution structure includes a first circuit layer and a second circuit layer disposed over the first circuit layer, in which the first circuit layer is electrically connected to the second circuit layer. The chip is disposed over the redistribution structure and electrically connected to the second circuit layer. The inner conductive reinforcing element is disposed over the redistribution structure. The inner conductive reinforcing element includes a reinforcing layer and a conductive connecting member. The reinforcing layer has a Young's modulus in a range of from 30 to 200 GPa and has a through hole. The conductive connecting member is disposed in the through hole. A top and a bottom of the conductive connecting member are exposed outside the reinforcing layer and are electrically connected to the second circuit layer. The first protective layer covers the chip.

In some embodiments, the first protective layer covers a sidewall of an opening of the inner conductive reinforcing element.

In some embodiments, the inner conductive reinforcing element surrounds the chip.

In some embodiments, a material of the reinforcing layer includes but is not limited to bismaleimide-triazine resin, epoxy resin, glass or ceramic.

In some embodiments, an upper surface of the inner conductive reinforcing element and an upper surface of the first protective layer are coplanar.

In some embodiments, the package structure further includes a conductive member disposed at the bottom of the conductive connecting member and electrically connected to the second circuit layer.

In some embodiments, the package structure further includes an electronic component disposed over the first protective layer and electrically connected to the top of the conductive connecting member.

In some embodiments, the package structure further includes a substrate structure and a second protective layer. The substrate structure is disposed between the first protective layer and the electronic component, and the electronic component is electrically connected to the top of the conductive connecting member through the substrate structure. The second protective layer covers the electronic component.

In some embodiments, the package structure further includes the first protective layer filling a gap between the chip and the second redistribution layer.

In some embodiments, the first protective layer fills a gap between a portion of a bottom surface of the inner conductive reinforcing element and the second redistribution layer.

Some embodiment of the present disclosure further provides a method of manufacturing a package structure, which includes following operations: (i) providing a redistribution structure, in which the redistribution structure includes a first circuit layer and a second circuit layer disposed over the first circuit layer, and the first circuit layer is electrically connected to the second circuit layer; (ii) forming at least one inner conductive reinforcing element over the redistribution structure, in which the inner conductive reinforcing element includes: a reinforcing layer having a Young's modulus in a range of from 30 to 200 GPa, in which the reinforcing layer has a through hole; and a conductive connecting member disposed in the through hole, in which a top and a bottom of the conductive connecting member are exposed outside the reinforcing layer and are electrically connected to the second circuit layer; (iii) disposing a chip over the redistribution structure, in which the chip is electrically connected to the second circuit layer; and (iv) forming a first protective layer covering the chip and the inner conductive reinforcing element.

In some embodiments, operation (ii) includes following steps: (a) providing a substrate, in which the substrate has a Young's modulus in a range of from 30 to 200 GPa; (b) performing a drilling process on the substrate to form the reinforcing layer having the through hole; (c) forming the conductive connecting member in the through hole to form the inner conductive reinforcing element; and (d) disposing the inner conductive reinforcing element over the redistribution structure.

In some embodiments, operation (ii) of forming the inner conductive reinforcing element over the redistribution structure includes forming a conductive member at the bottom of the conductive connecting member and electrically connected to the second circuit layer.

In some embodiments, the method further includes (v) disposing an electronic component over the first protective layer, in which the electronic component is electrically connected to the top of the conductive connecting member.

In some embodiments, in operation (v), the electronic component is disposed over a substrate structure and covered by a second protective layer, and the electronic component is electrically connected to the top of the conductive connecting member through the substrate structure.

BRIEF DESCRIPTION OF THE DRAWINGS

Various aspects of the present disclosure will be most easily understood when the following detailed description is read in conjunction with the accompanying drawings. It should be noted that according to industry standard operating procedures, various characteristic structures may not be drawn to scale. In fact, for clarity of discussion, the size of various characteristic structures can be arbitrarily increased or decreased.

DETAILED DESCRIPTION

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "below," "over," "on," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" or "below" to "over" or "on." In addition, the spatially relative descriptions used herein should be interpreted the same.

Figure 1:
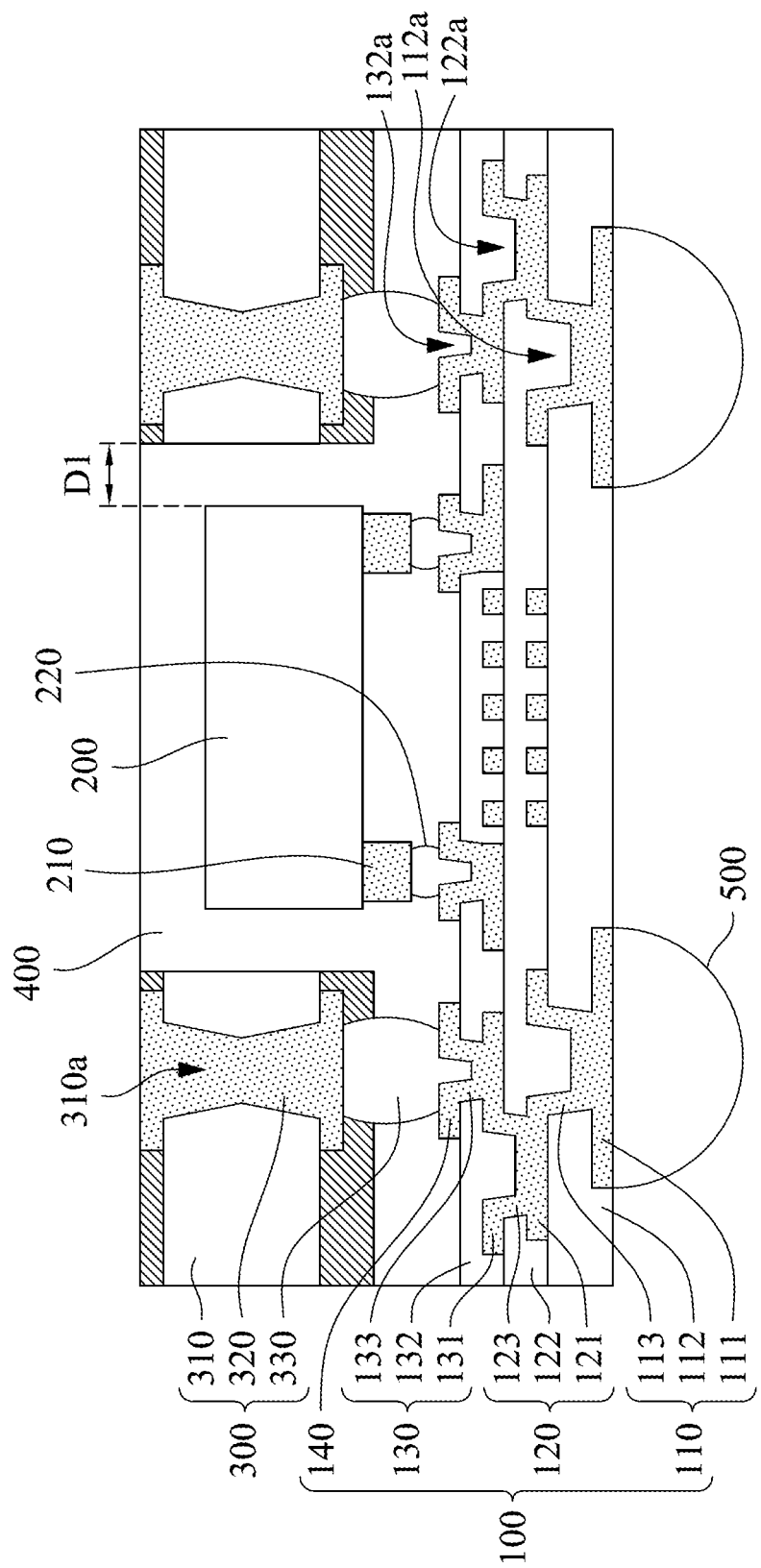
FIG. 1 is a schematic cross-sectional view of a package structure according to a first embodiment of the present disclosure.

Please refer to FIG. 1. FIG. 1 is a schematic cross-sectional view of a package structure 10 according to a first embodiment of the present disclosure. The package structure 10 includes a redistribution structure 100, a chip 200, an inner conductive reinforcing element 300, a first protective layer 400, and a solder ball 500.

In some embodiments, the redistribution structure 100 includes, but is not limited to, one or more redistribution layers, depending on the actual design and requirements.

In one embodiment, the redistribution structure 100 includes three redistribution layers. The redistribution structure 100 includes a first redistribution layer 110, a second redistribution layer 120, a third redistribution layer 130, and a conductive pad 140. Specifically, the first redistribution layer 110 includes a first circuit layer 111, a first insulating layer 112, and a first conductive contact 113. In some embodiments, the first circuit layer 111 and the first conductive contact 113 include any conductive material, such as a metal such as copper, nickel, or silver. In some embodiments, the line width and line spacing of the first circuit layer 111 are less than 8 microns, such as 7 microns, 6 microns, 5 microns, 4 microns, 3 microns, 2 microns, 1 micron, or 0.5 micron. The first insulating layer 112 covers the first circuit layer 111, and the first insulating layer 112 has a via hole 112a. In some embodiments, the first insulating layer 112 includes a photosensitive dielectric material. The via hole 112a exposes a portion of the first circuit layer 111, and the first conductive contact 113 is conformally formed in the via hole 112a, so that the first conductive contact 113 is in contact with the first circuit layer 111.

The second redistribution layer 120 is disposed over the first redistribution layer 110. Specifically, the second redistribution layer 120 includes a second circuit layer 121, a second insulating layer 122, and a second conductive contact 123. The second circuit layer 121 is in contact with the first conductive contact 113, so that the second circuit layer 121 is electrically connected to the first circuit layer 111. In some embodiments, the second circuit layer 121 and the second conductive contact 123 include any conductive material, such as a metal such as copper, nickel, or silver. In some embodiments, the line width and line spacing of the second circuit layer 121 are less than 8 microns, such as 7 microns, 6 microns, 5 microns, 4 microns, 3 microns, 2 microns, 1 micron, or 0.5 micron. The second insulating layer 122 covers the second circuit layer 121, and the second insulating layer 122 has a via hole 122a. In some embodiments, the second insulating layer 122 includes a photosensitive dielectric material. The via hole 122a exposes a portion of the second circuit layer 121, and the second conductive contact 123 is conformally formed in the via hole 122a, so that the second conductive contact 123 is in contact with the second circuit layer 121.

The third redistribution layer 130 is disposed over the second redistribution layer 120. Specifically, the third redistribution layer 130 includes a third circuit layer 131, a third insulating layer 132, and a third conductive contact 133. The third circuit layer 131 is in contact with the second conductive contact 123, so that the third circuit layer 131 and the second circuit layer 121 are electrically connected. In some embodiments, the third circuit layer 131 and the third conductive contact 133 include any conductive material, such as a metal such as copper, nickel, or silver. In some embodiments, the line width and line spacing of the third circuit layer 131 are less than 8 microns, such as 7 microns, 6 microns, 5 microns, 4 microns, 3 microns, 2 microns, 1 micron, or 0.5 micron. The third insulating layer 132 covers the third circuit layer 131, and the third insulating layer 132 has a via hole 132a. In some embodiments, the third insulating layer 132 includes a photosensitive dielectric material. The via hole 132a exposes a portion of the third circuit layer 131, and the third conductive contact 133 is conformally formed in the via hole 132a, so that the third conductive contact 133 is in contact with the third circuit layer 131.

The conductive pad 140 is in contact with the third conductive contact 133, so that the conductive pad 140 is electrically connected to the third circuit layer 131. In some embodiments, the conductive pad 140 includes any conductive material, such as a metal such as copper, nickel, or silver.

The chip 200 is disposed over the redistribution structure 100 and is electrically connected to the third circuit layer 131. Specifically, a lower surface of the chip 200 is provided with a plurality of metal bumps 210 (e.g., chip pins), and the metal bump 210 is bonded to the conductive pad 140 and the third conductive contact 133 through a solder material 220, so that the chip 200 and the third circuit layer 131 are electrically connected.

The inner conductive reinforcing element 300 is disposed over the redistribution structure 100, and the inner conductive reinforcing element 300 includes a reinforcing layer 310 and a conductive connecting member 320. In some embodiments, the conductive connecting member 320 includes any conductive material, such as a metal such as copper, nickel, or silver. Specifically, the reinforcing layer 310 has a through hole 310a, and the conductive connecting member 320 is disposed in the through hole 310a. More specifically, a top and a bottom of the conductive connecting member 320 are exposed outside the reinforcing layer 310. In some embodiments, the conductive connecting member 320 and the third circuit layer 131 are electrically connected through a conductive member 330. In one embodiment, the conductive member includes a solder bump disposed at the bottom of the conductive connecting member 320, so that the conductive connecting member 320 is electrically connected to the third circuit layer 131. More specifically, the solder bump may be a solder ball, and the material thereof includes lead, tin, silver, copper, bismuth, antimony, zinc, or other welding metals, but is not limited thereto. In some embodiments, the inner conductive reinforcing element 300 further includes two protective layers on an upper surface and a lower surface of the reinforcing layer 310, and the material thereof may be a solder resist material or a resin material, such as epoxy resin. The method of forming the protective layer may be, for example, a method such as lamination, printing, or coating. More specifically, the top of the conductive connecting member 320 is exposed outside the upper protective layer and is coplanar with the protective layer, and the conductive member 330 bonded to the bottom of the conductive connecting member 320 protrudes from the lower protective layer. It should be understood that the reinforcing layer 310 has a Young's modulus in a range of from 30 to 200 GPa, such as 100, 150, or 200 GPa. As mentioned above, the conventional chip package structure often suffers from severe warping due to thermal processes. In particular, when the size of the chip package structure exceeds a certain range, the warping phenomenon is particularly serious, for example, when the length of the chip package structure is 15 mm or more and the width thereof is 15 mm or more. However, by providing the reinforcing layer 310, the package structure 10 of the present disclosure is less prone to warping.

Specifically, the reinforcing layer 310 has the Young's modulus in a range of from 30 to 200 GPa, and thus provides sufficient mechanical strength of the package structure 10. According to this, even if differences of the thermal expansion coefficients of the element materials in the package structure 10 are great, it is difficult to cause warping. In some embodiments, the reinforcing layer 310 includes, but is not limited to, bismaleimide-tirazine (BT) resin, epoxy resin, solder paste, or copper paste. Preferably, in some embodiments, the reinforcing layer 310 and the chip 200 have a horizontal distance D1 in a range of from 50 to 1,000 microns.

In another embodiment, the redistribution structure 100 includes two redistribution layers. For example, the redistribution structure 100 includes a first redistribution layer 110 and a third redistribution layer 130. The package structure 10 having two redistribution layers or three redistribution layers is electrically connected to the chip 20 through the uppermost redistribution layer, and the inner conductive reinforcing element 300 is disposed over the uppermost redistribution layer. Other components are the same as the embodiments of the three redistribution layers, so those will not be described again.

Figure 2:
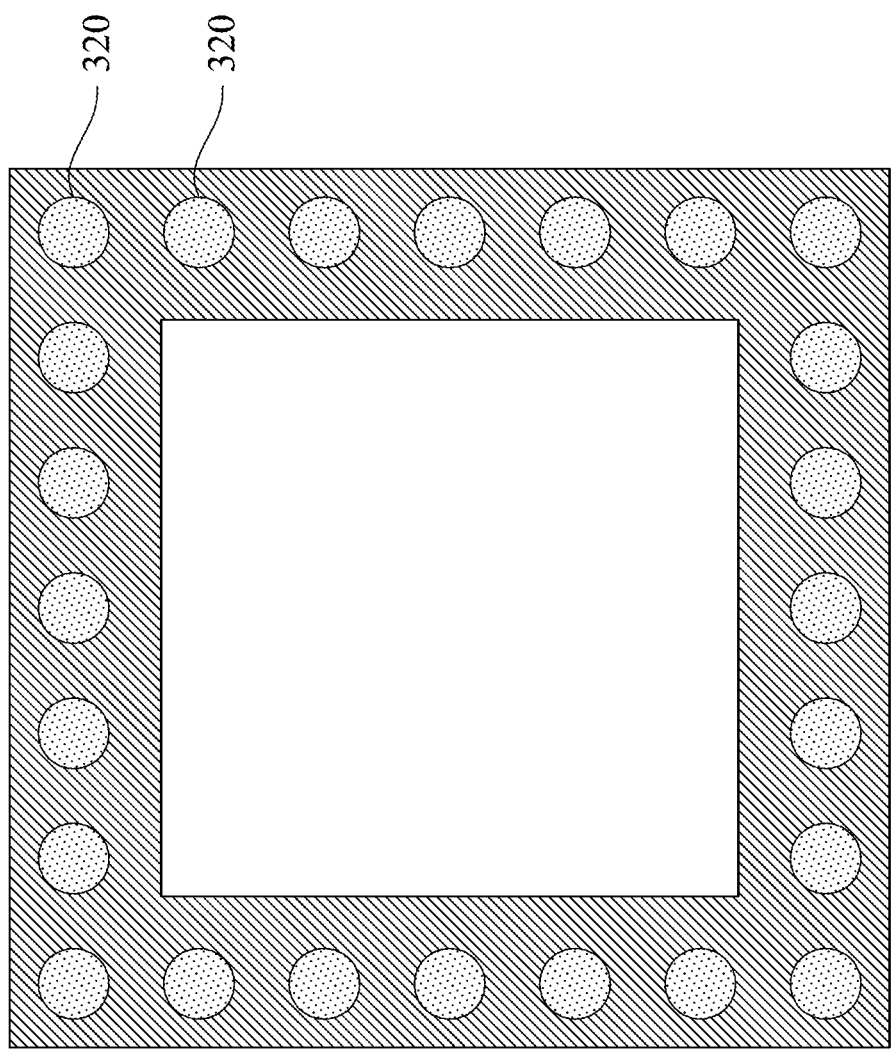
FIG. 2 is a schematic top view of the package structure according to the first embodiment of the present disclosure.

FIG. 2 is a schematic top view of a package structure 10 according to an embodiment of the present disclosure. As shown in FIG. 2, the conductive connecting members 320 of the inner conductive reinforcing element 300 are disposed on four sides adjacent to the package structure 10, and exposed portions are the tops of the conductive connecting members 320.

Returning to FIG. 1, the first protective layer 400 covers the chip 200 and a sidewall of an opening and a portion of a bottom surface of the inner conductive reinforcing element 300, and fills a gap between the chip 200 and the third redistribution layer 130 and a gap between the portion of the bottom surface of the inner conductive reinforcing element 300 and the third redistribution layer 130. Specifically, an upper surface of the inner conductive reinforcing element 300 and an upper surface of the first protective layer 400 are coplanar. The first protective layer 400 can protect the bonding between the metal bump 210 and the soldering material 220 of the chip 200 and the conductive pad 140, thereby avoiding the occurrence of peeling. On the other hand, the first protective layer 400 can also block moisture and prevent oxidation of the metal bumps 210, the soldering material 220, and the conductive pad 140. In some embodiments, the first protective layer 400 includes a resin.

The solder ball 500 is disposed beneath the redistribution structure 100. Specifically, the solder ball 500 is in contact with the first circuit layer 111, so that the solder ball 500 is electrically connected to the first circuit layer 111. In some embodiments, the solder ball 500 includes lead, tin, silver, copper, bismuth, antimony, zinc, or other welding metals, but is not limited thereto.

Figure 3:
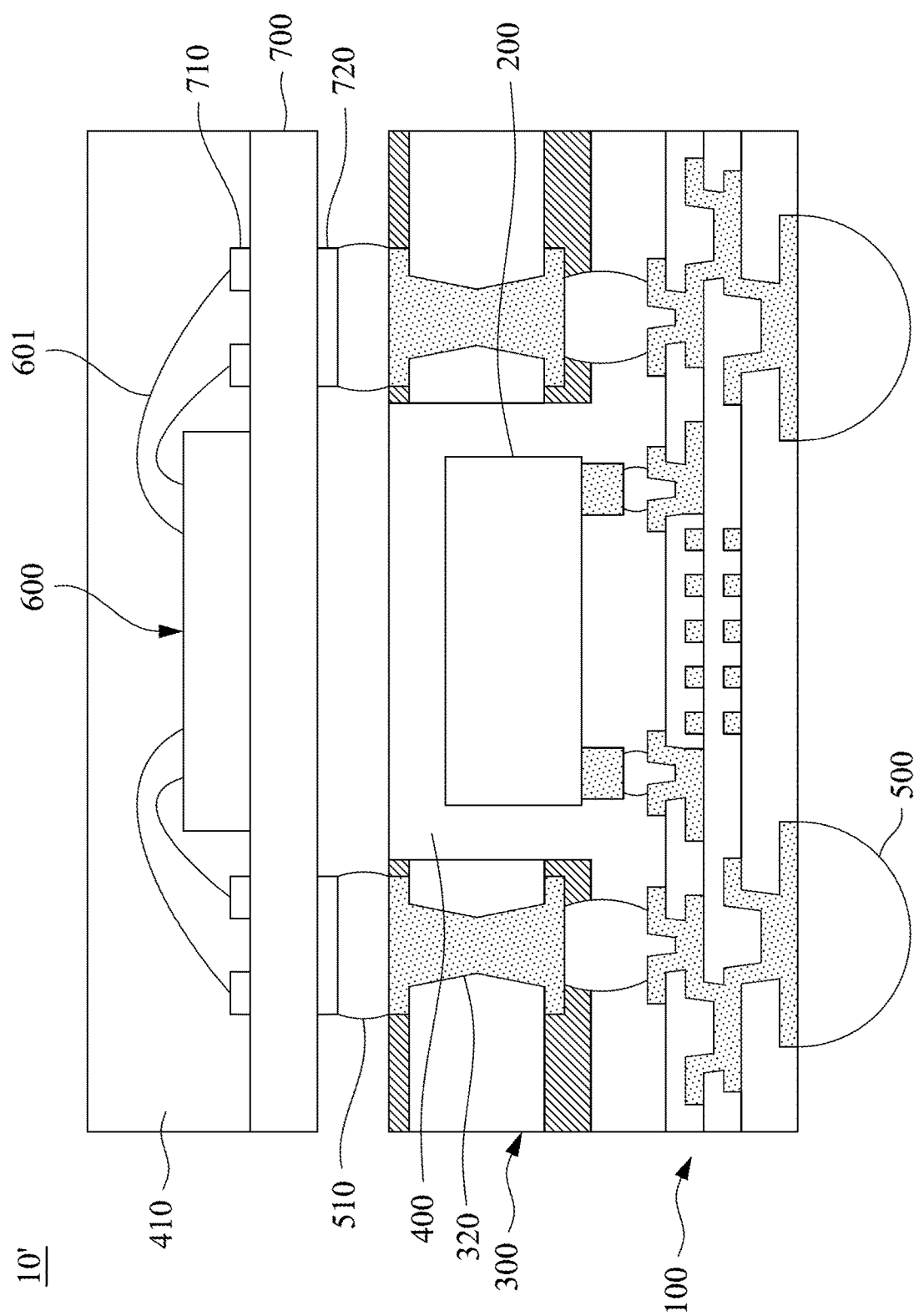
FIG. 3 is a schematic cross-sectional view of a package structure according to a second embodiment of the present disclosure.

Please refer to FIG. 3, which is a schematic cross-sectional view of a package structure 10' according to a second embodiment of the present disclosure. The package structure 10' includes a redistribution structure 100, a chip 200, an inner conductive reinforcing element 300, a first protective layer 400, a solder ball 500, and an electronic component 600. For details of the redistribution structure 100, the chip 200, the inner conductive reinforcing element 300, the first protective layer 400, and the solder ball 500, please refer to the description in FIG. 1 and the corresponding relevant paragraphs, and will not be repeated here.

The electronic component 600 is disposed over the first protective layer 400 and is electrically connected to a top of the conductive connecting member 320. Specifically, the electronic component 600 is disposed over a substrate structure 700 and is covered by a second protective layer 410. The substrate structure 700 has a first conductive pad 710, a second conductive pad 720, and an internal circuit, and the internal circuit is electrically connected to the first conductive pad 710 and the second conductive pad 720. As shown in FIG. 3, the electronic component 600 is electrically connected to the first conductive pad 710 through a wire 601. In addition, the second conductive pad 720 is electrically connected to the top of the conductive connecting member 320 through a soldering material 510. In some embodiments, the soldering material 510 includes lead, tin, silver, copper, bismuth, antimony, zinc, or other welding metals, but is not limited thereto.

The second protective layer 410 can block moisture and prevent oxidation of the wire 601 and the first conductive pad 710. In some embodiments, the second protective layer 410 includes a resin. In some embodiments, the electronic component 600 is a memory.

The present disclosure also provides a method of manufacturing the package structure. FIGS. 4 to 12 are schematic cross-sectional views of a method of manufacturing the package structure 10 at various stages according to the first embodiment of the present disclosure.

Figure 4:
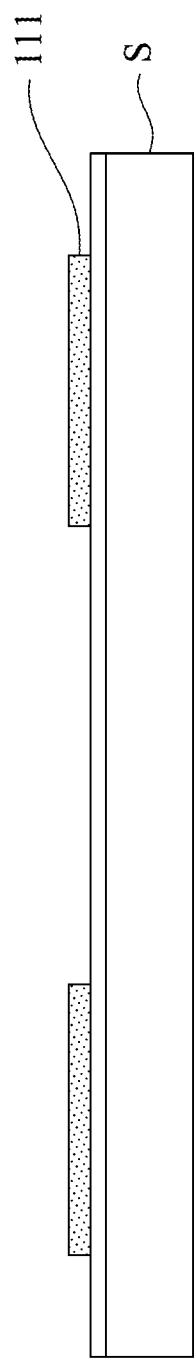
FIGS. 4 to 12 are schematic cross-sectional views of a method of manufacturing the package structure at various stages according to the first embodiment of the present disclosure.

As shown in FIG. 4, a release film is formed over a substrate S, and the first circuit layer 111 is formed over the release film. For example, a conductive material is formed over the release film, and the conductive material is then patterned to form the first circuit layer 111. In some embodiments, the method of forming the conductive material includes electroplating, chemical vapor deposition, physical vapor deposition, and the like, but is not limited thereto.

Figure 5:
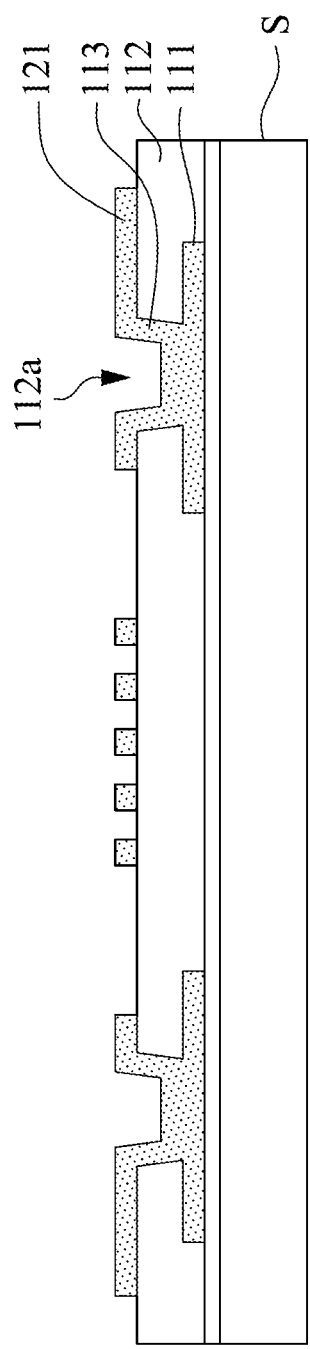

Next, as shown in FIG. 5, the first insulating layer 112 is formed covering the first circuit layer 111, and the first insulating layer 112 includes the via hole 112a that exposes a portion of the first circuit layer 111. For example, a dielectric material is formed over the first circuit layer 111, and the dielectric material is then patterned to form the via hole 112a. In some embodiments, the method of forming the dielectric material includes chemical vapor deposition, physical vapor deposition, and the like, but is not limited thereto. In some embodiments, a method of patterning the conductive material and the dielectric material includes depositing a photoresist on the layer to be patterned, and exposure and development are then performed to form a patterned photoresist layer. The patterned photoresist layer is used as an etching mask to etch the layer to be patterned. Finally, the patterned photoresist layer is removed. Alternatively, in an embodiment where the dielectric material is a photosensitive dielectric material, the patterning process can be achieved by performing exposure and development to remove a portion of the photosensitive dielectric material.

Next, the second circuit layer 121 is formed over the first insulating layer 112, and the first conductive contact 113 is conformally formed in the via hole 112a. For example, a conductive material is formed over the first insulating layer 112 and is conformally formed in the via hole 112a. Next, the conductive material is patterned to form the second circuit layer 121 and the first conductive contact 113.

Figure 6:
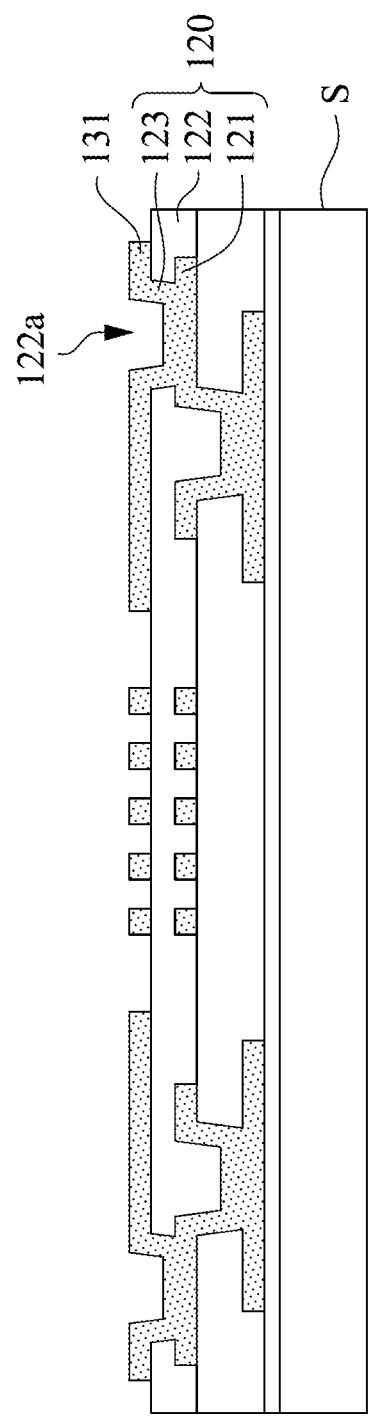

Next, as shown in FIG. 6, the second insulating layer 122 is formed covering the second circuit layer 121, and the second insulating layer 122 includes the via hole 122a that exposes a portion of the second circuit layer 121. For example, a dielectric material is formed over the second circuit layer 121, and the dielectric material is then patterned to form the via hole 122a.

Next, the third circuit layer 131 is formed over the second insulating layer 122, and the second conductive contact 123 is conformally formed in the via hole 122a. For example, a conductive material is formed over the second insulating layer 122 and is conformally formed in the via hole 122a. Next, the conductive material is patterned to form the third circuit layer 131 and the second conductive contact 123.

Figure 7:
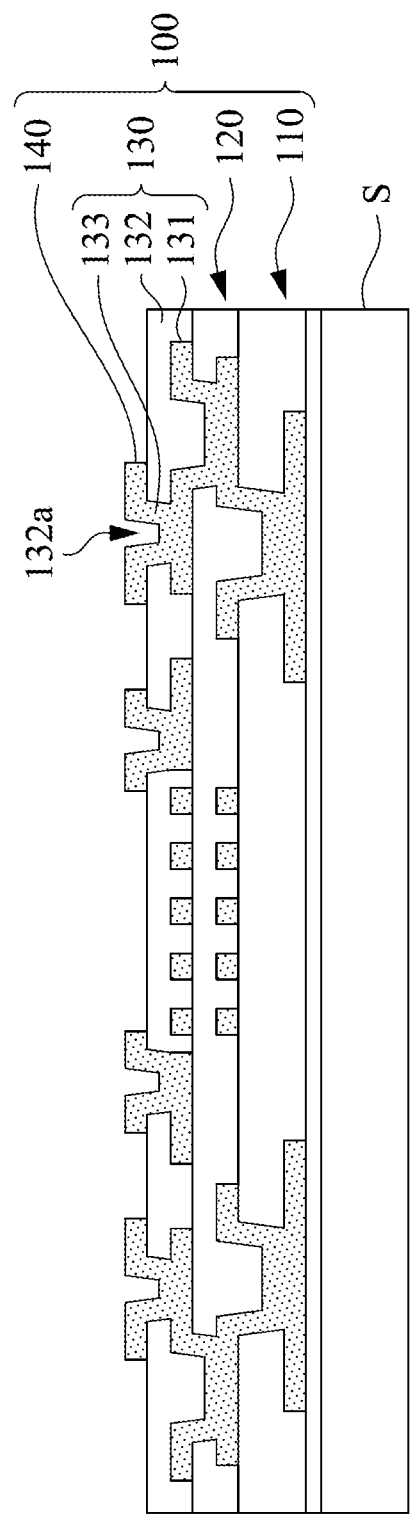

Next, as shown in FIG. 7, the third insulating layer 132 is formed covering the third circuit layer 131, and the third insulating layer 132 includes the via hole 132a which exposes a portion of the third circuit layer 131. For example, a dielectric material is formed over the third circuit layer 131, and the dielectric material is then patterned to form the via hole 132a.

Next, the conductive pad 140 is formed over the third insulating layer 132, and the third conductive contact 133 is conformally formed in the via hole 132a. For example, a conductive material is formed over the third insulating layer 132 and is conformally formed in the via hole 132a. Next, the conductive material is patterned to form the conductive pad 140 and the third conductive contact 133. Thus, the redistribution structure 100 is formed over the substrate S. It is worth mentioning that the conductive pad 140 has a recess to provide a specific technical effect. Specifically, when the conductive connecting member 320 and the conductive pad 140 are bonded, the bottom of the conductive connecting member 320 is aligned with and squeeze an inclined surface of the recess of the conductive pad 140 by the conductive member 330.

Figure 8:
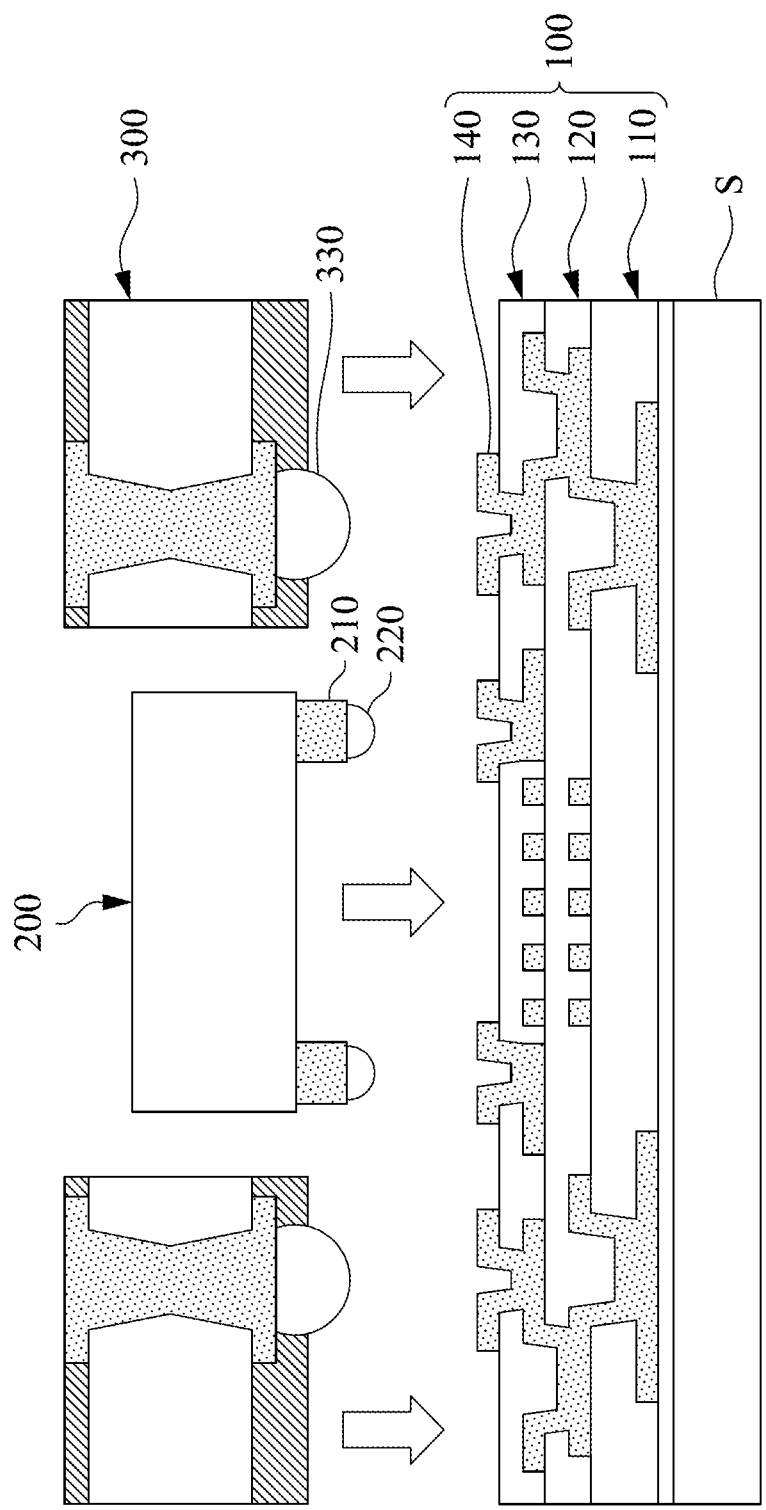
Figure 9:
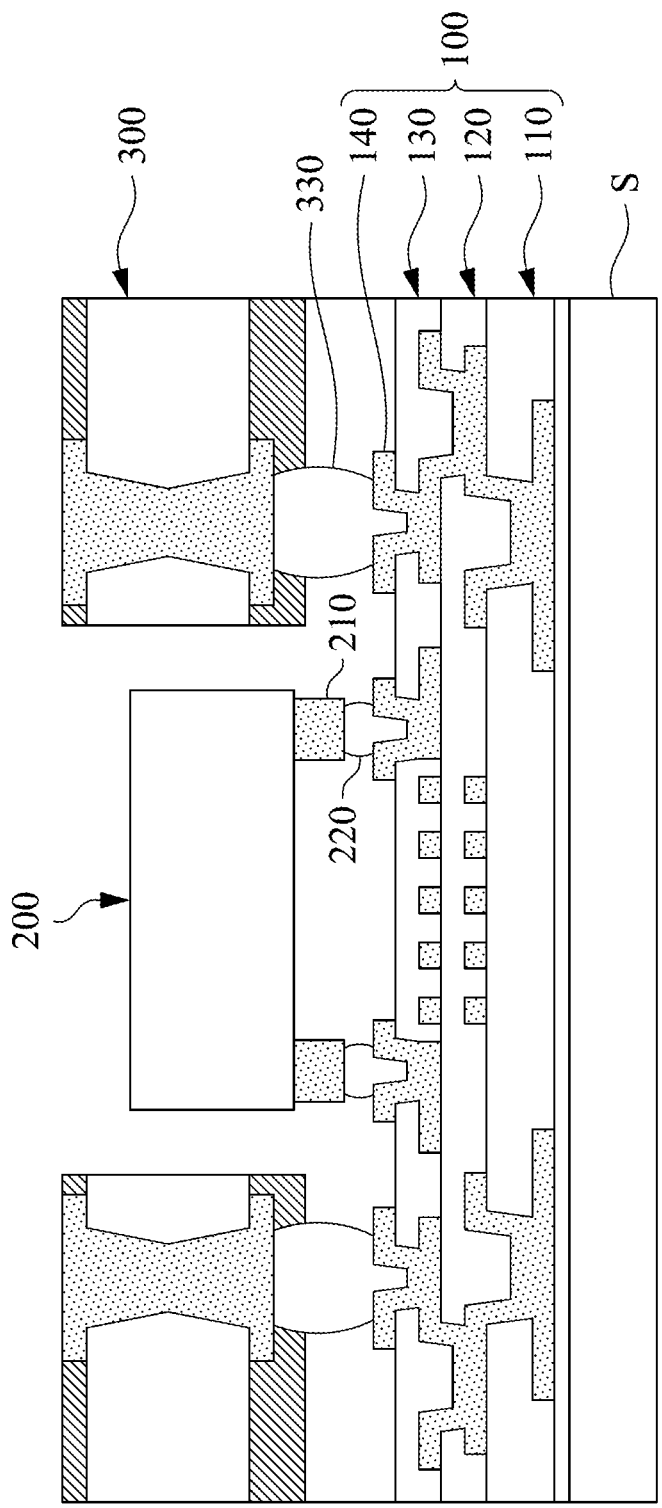

Next, as shown in FIGS. 8 and 9, the inner conductive reinforcing element 300 is formed over the redistribution structure 100. For example, the plurality of conductive members 330 on the lower surface of the inner conductive reinforcing member 300 are bonded to the conductive pads 140, and the inner conductive reinforcing member 300 is attached to the third redistribution layer 130 by using the conductive member 330.

Next, as shown in FIGS. 8 and 9, the chip 200 is disposed over the redistribution structure 100. For example, the plurality of metal bumps 210 (e.g., chip pins) on the lower surface of the chip 200 are bonded to the conductive pads 140 using the soldering material 220.

Figure 10:
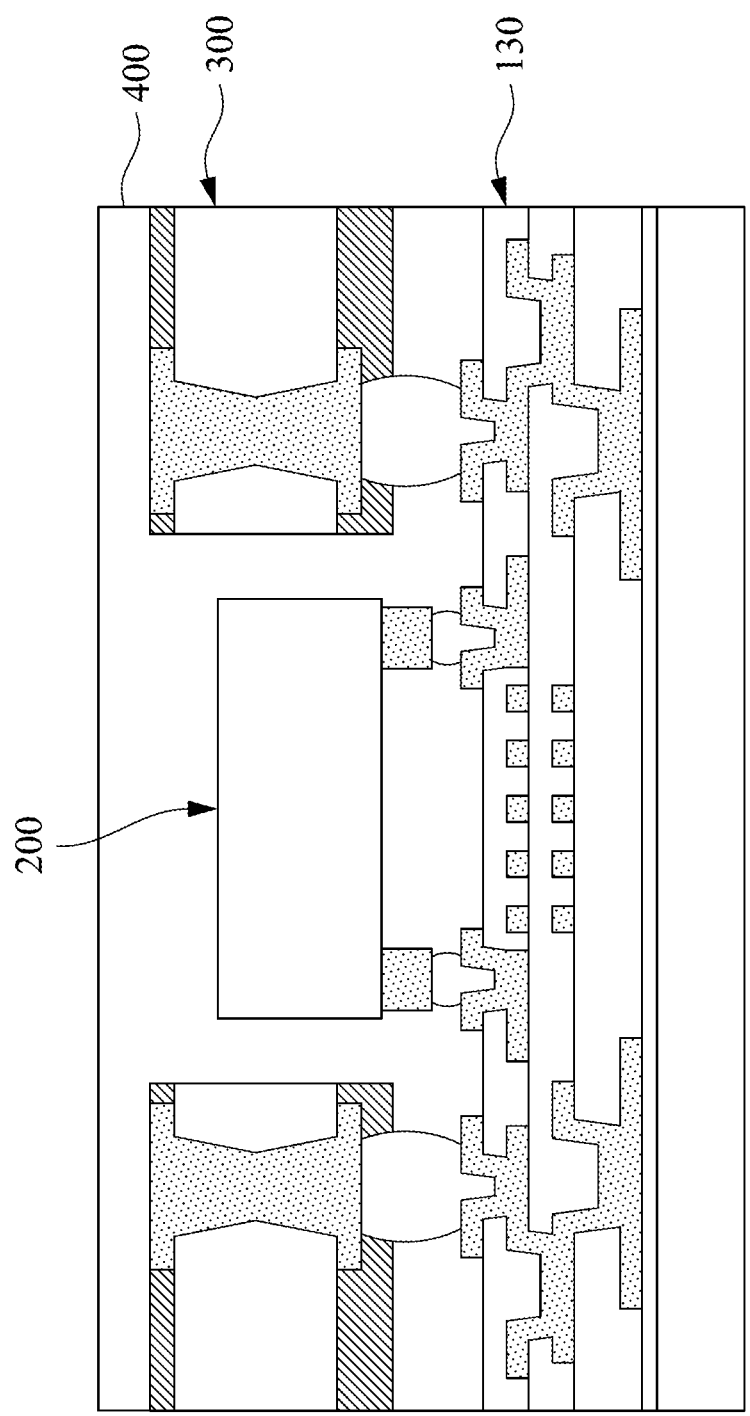

Next, as shown in FIG. 10, the first protective layer 400 is formed covering the chip 200 and the inner conductive reinforcing element 300 and fills the gap between the chip 200 and the third redistribution layer 130.

Figure 11:
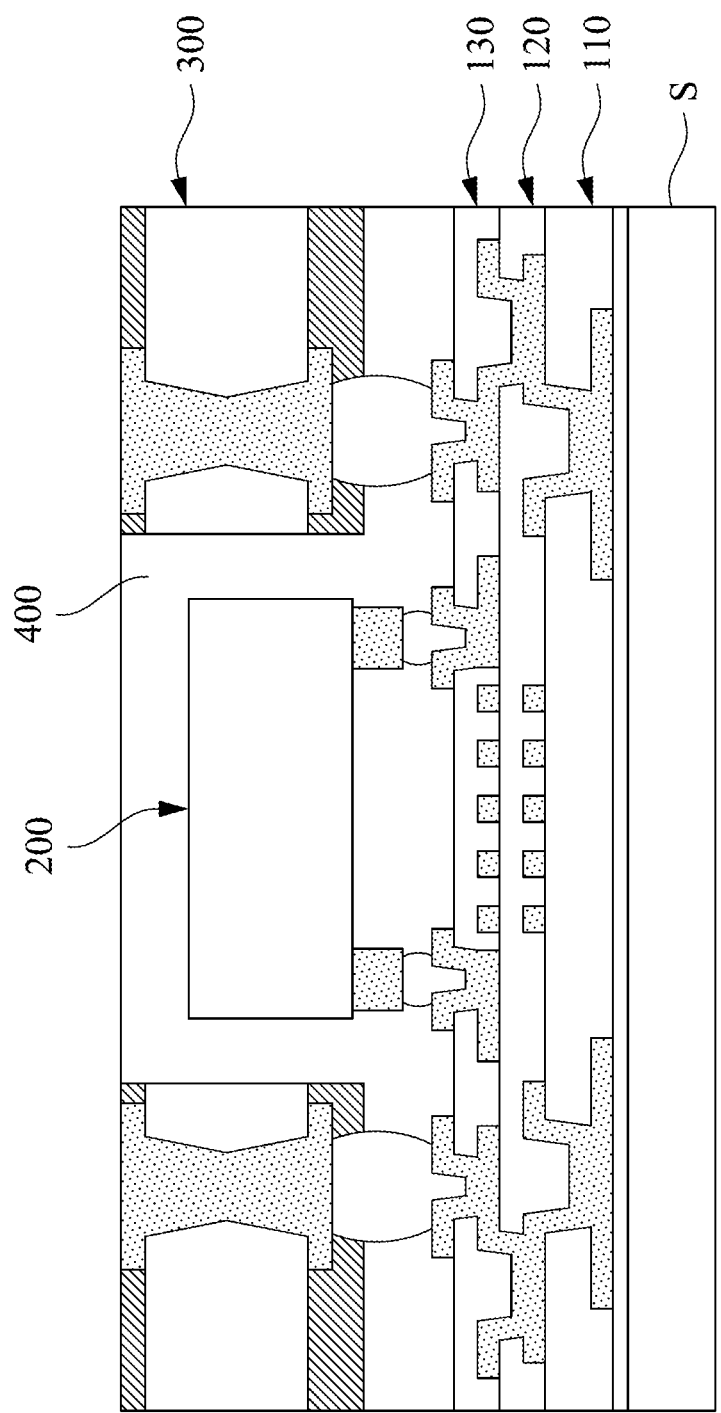

Next, the top of the first protective layer 400 is removed using a chemical mechanical polishing (CMP) process, so as to form the first protective layer 400 that exposes an upper surface of the inner conductive reinforcing element 300, as shown in FIG. 11. It should be noted that removing the top of the first protective layer 400 provides a specific technical effect. Specifically, the thermal expansion coefficient of the material of the first protective layer 400 is generally different from the thermal expansion coefficients of other components, so the excessively thick first protective layer 400 may easily cause warping of the package structure. By removing the top of the first protective layer 400, the warping phenomenon of the package structure can be improved.

Figure 12:
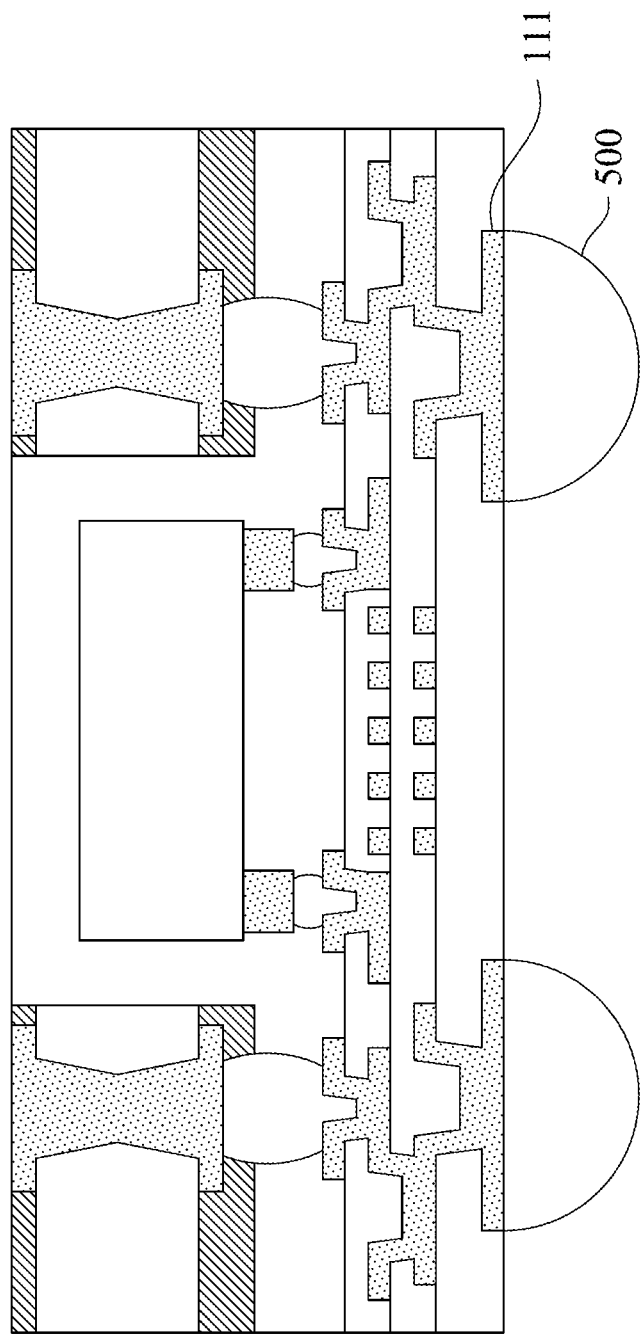

Next, the release film and the substrate S are peeled to expose the first circuit layer 111. Subsequently, as shown in FIG. 12, the solder ball 500 is formed to be in contact with the first circuit layer 111, thereby forming a package structure 10.

The method of manufacturing the package structure 10' at various stages according to the second embodiment of the present disclosure are shown in the schematic cross-sectional views of FIGS. 4 to 11. Next, as shown in FIG. 3, the electronic component 600 is disposed over the first protective layer 400, so that the electronic component 600 is electrically connected to the top of the conductive connecting member 320. Specifically, the second conductive pad 720 is bonded to the top of the conductive connecting member 320 by using the soldering material 510. The electronic component 600 is electrically connected to the first conductive pad 710 through the wire 601, and the first conductive pad 710 is electrically connected to the second conductive pad 720 through the internal circuit. Therefore, the electronic component 600 is electrically connected to the top of the conductive connecting member 320.

Next, the release film and the substrate S are peeled to expose the first circuit layer 111. Subsequently, the solder ball 500 is formed to be in contact with the first circuit layer 111, thereby forming the package structure 10' as shown in FIG. 3.

It can be known from the foregoing embodiments of the present disclosure that the package structure of some embodiments of the present disclosure has sufficient mechanical strength. Therefore, even if differences of the thermal expansion coefficients of the element materials in the package structure are very great, it is difficult to cause warping. In addition, since the package structure is not prone to warping, it is suitable to dispose another package structure on the package structure to fabricate a stacked package structure.

While the present disclosure has been disclosed above in the embodiments, other embodiments are possible. Therefore, the spirit and scope of the claims are not limited to the description contained in the embodiments herein.

It is apparent to those skilled in the art that various alternations and modifications may be made without departing from the spirit and scope of the present disclosure, and the scope of the present disclosure is defined by the scope of the appended claims.

What is claimed is:

1. A package structure, including:
    a redistribution structure comprising a first circuit layer and a second circuit layer disposed over the first circuit layer, wherein the first circuit layer is electrically connected to the second circuit layer;
    a chip disposed over the redistribution structure and electrically connected to the second circuit layer;
    at least one inner conductive reinforcing element disposed over the redistribution structure, wherein the inner conductive reinforcing element comprises:
    a reinforcing layer having a Young's modulus in a range of from 30 to 200 GPa, wherein the reinforcing layer has a through hole;
    a conductive connecting member disposed in the through hole, wherein a top and a bottom of the conductive connecting member are exposed outside the reinforcing layer and are electrically connected to the second circuit layer;
    a first protective layer covering the chip; and
    a conductive member disposed at the bottom of the conductive connecting member and electrically connected to the second circuit layer.

2. The package structure of claim 1, wherein the first protective layer covers a sidewall of an opening of the inner conductive reinforcing element.

3. The package structure of claim 1, wherein the inner conductive reinforcing element surrounds the chip.

4. The package structure of claim 1, wherein a material of the reinforcing layer comprises bismaleimide-triazine resin, epoxy resin, glass or ceramic.

5. The package structure of claim 1, wherein an upper surface of the inner conductive reinforcing element and an upper surface of the first protective layer are coplanar.

6. The package structure of claim 2, further comprising an electronic component disposed over the first protective layer and electrically connected to the top of the conductive connecting member.

7. The package structure of claim 6, further comprising:
    a substrate structure disposed between the first protective layer and the electronic component, and the electronic component electrically connected to the top of the conductive connecting member through the substrate structure; and
    a second protective layer covering the electronic component.

8. The package structure of claim 1, further comprising the first protective layer filling a gap between the chip and the second redistribution layer.

9. The package structure of claim 8, further comprising the first protective layer filling a gap between a portion of a bottom surface of the inner conductive reinforcing element and the second redistribution layer.

10. A method of manufacturing a package structure, comprising following operations:
    (i) providing a redistribution structure, wherein the redistribution structure comprises a first circuit layer and a second circuit layer disposed over the first circuit layer, and the first circuit layer is electrically connected to the second circuit layer;
    (ii) forming at least one inner conductive reinforcing element over the redistribution structure, wherein the inner conductive reinforcing element comprises:
    a reinforcing layer having a Young's modulus in a range of from 30 to 200 GPa, wherein the reinforcing layer has a through hole; and
    a conductive connecting member disposed in the through hole, wherein a top and a bottom of the conductive connecting member are exposed outside the reinforcing layer and are electrically connected to the second circuit layer;
    a conductive member at the bottom of the conductive connecting member and electrically connected to the second circuit layer;
    (iii) disposing a chip over the redistribution structure, wherein the chip is electrically connected to the second circuit layer; and
    (iv) forming a first protective layer covering the chip and the inner conductive reinforcing element.

11. The method of manufacturing the package structure of claim 10, wherein operation (ii) comprises following steps:
    (a) providing a substrate, wherein the substrate has a Young's modulus in a range of from 30 to 200 GPa;
    (b) performing a drilling process on the substrate to form the reinforcing layer having the through hole;
    (c) forming the conductive connecting member in the through hole to form the inner conductive reinforcing element; and
    (d) disposing the inner conductive reinforcing element over the redistribution structure.

12. The method of manufacturing the package structure of claim 10, further comprising (v) disposing an electronic component over the first protective layer, wherein the electronic component is electrically connected to the top of the conductive connecting member.

13. The method of manufacturing the package structure of claim 12, wherein in operation (v), the electronic component is disposed over a substrate structure and covered by a second protective layer, and the electronic component is electrically connected to the top of the conductive connecting member through the substrate structure.

* * * * *

UNITED STATES PATENT AND TRADEMARK OFFICE
CERTIFICATE OF CORRECTION

PATENT NO.        : 10,950,535 B2
APPLICATION NO.   : 16/785630
DATED             : March 16, 2021
INVENTOR(S)       : Chun-Min Wang, Pu-Ju Lin and Cheng-Ta Ko It is certified that error appears in the above-identified patent and that said Letters Patent is hereby corrected as shown below:

On the Title Page

The Related U.S. Application Data should read as "Continuation-in-part of application No. 16/240,806, filed on Jan. 7, 2019, now Pat. No. 10,685,922, which is a continuation-in-part of application No. 15/590,020, filed on May 9, 2017, now Pat. No. 10,178,755." rather than "Continuation-in-part of application No. 16/420,806, filed on Jan. 7, 2019, now Pat. No. 10,685,922, which is a continuation-in-part of application No. 15/590,020, filed on May 9, 2017, now Pat. No. 10,178,755."

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*